(12) United States Patent
Nelson

(10) Patent No.: US 11,336,247 B1
(45) Date of Patent: May 17, 2022

(54) HIGH EFFICIENCY WIDEBAND FEEDBACK AMPLIFIER

(71) Applicant: ENGIN-IC, Inc., Plano, TX (US)

(72) Inventor: Stephen R. Nelson, Plano, TX (US)

(73) Assignee: ENGIN-IC, Inc., Plano, TX (US)

( * ) Notice: Subject to any disclaimer, the term of this patent is extended or adjusted under 35 U.S.C. 154(b) by 0 days.

(21) Appl. No.: 17/452,779

(22) Filed: Oct. 29, 2021

(51) Int. Cl.
| | |
|---|---|
| *H03F 3/16* | (2006.01) |
| *H03F 3/60* | (2006.01) |
| *H03F 1/56* | (2006.01) |
| *H03F 3/195* | (2006.01) |
| *H03F 3/24* | (2006.01) |
| *H03F 1/34* | (2006.01) |
| *H01P 3/08* | (2006.01) |
| *H01P 5/08* | (2006.01) |
| *H01L 29/772* | (2006.01) |
| *H01P 3/02* | (2006.01) |

(52) U.S. Cl.
CPC ........... *H03F 3/604* (2013.01); *H01L 29/772* (2013.01); *H01P 3/026* (2013.01); *H01P 3/081* (2013.01); *H01P 5/08* (2013.01); *H03F 1/342* (2013.01); *H03F 1/565* (2013.01); *H03F 3/195* (2013.01); *H03F 3/245* (2013.01); *H01L 2924/1306* (2013.01)

(58) Field of Classification Search
CPC ........................................................ H03F 3/16
USPC .................................................. 330/277, 307
See application file for complete search history.

(56) References Cited

U.S. PATENT DOCUMENTS

| | | | | |
|---|---|---|---|---|
| 4,614,915 | A | * 9/1986 | Heston | ................ H01L 27/0605 257/E27.012 |
| 5,966,520 | A | * 10/1999 | Buer | ...................... H03F 3/604 330/286 |
| 6,313,512 | B1 | 11/2001 | Schmitz et al. | |
| 9,401,682 | B2 | * 7/2016 | Blednov | ................. H03F 3/245 |

OTHER PUBLICATIONS

Freescale Semiconductor Application Note, "Match Impedances in Microwave Amplifiers," AN1033, Rev. 0, Jul. 1993.
M. Lahsaini, et al. "Broadband Impedance Matching Techniques for Microwave Amplifiers [10-12] GHz," International Review on Modelling and Simulations (I.RE.MO.S.), vol. 6, N. 3, Jun. 2013.
Andrei Grebennikov, "Linearity Improvement Techniques for Wireless Transmitters: Part 2," High Frequency Electronics, Jun. 2009.
Xiangning Fan, et al. "Design of a 2.4 GHz Power Amplifier," 2015 IEEE MTT-S International Microwave Workshop Series on Advanced Materials and Processes for RF and THz Applications, Jul. 1-3, 2015.

* cited by examiner

*Primary Examiner* — Henry Choe
(74) *Attorney, Agent, or Firm* — Hunton Andrews Kurth LLP

(57) ABSTRACT

According to an embodiment of the disclosure, a series or source feedback is provided to a solid-state power amplifier to achieve improved amplifier output power, good impedance match, and low voltage standing wave ratio (VSWR). In an embodiment, an inductive element is coupled to the source of the power amplifier transistor to serve as a series or source feedback for the transistor. In an embodiment, a high-impedance transmission line such as a microstrip or coplanar waveguide is provided as an inductive element coupled to the source of the transistor. In an embodiment, a series or source feedback is provided to each amplifier in a multistage amplifier circuit.

17 Claims, 12 Drawing Sheets

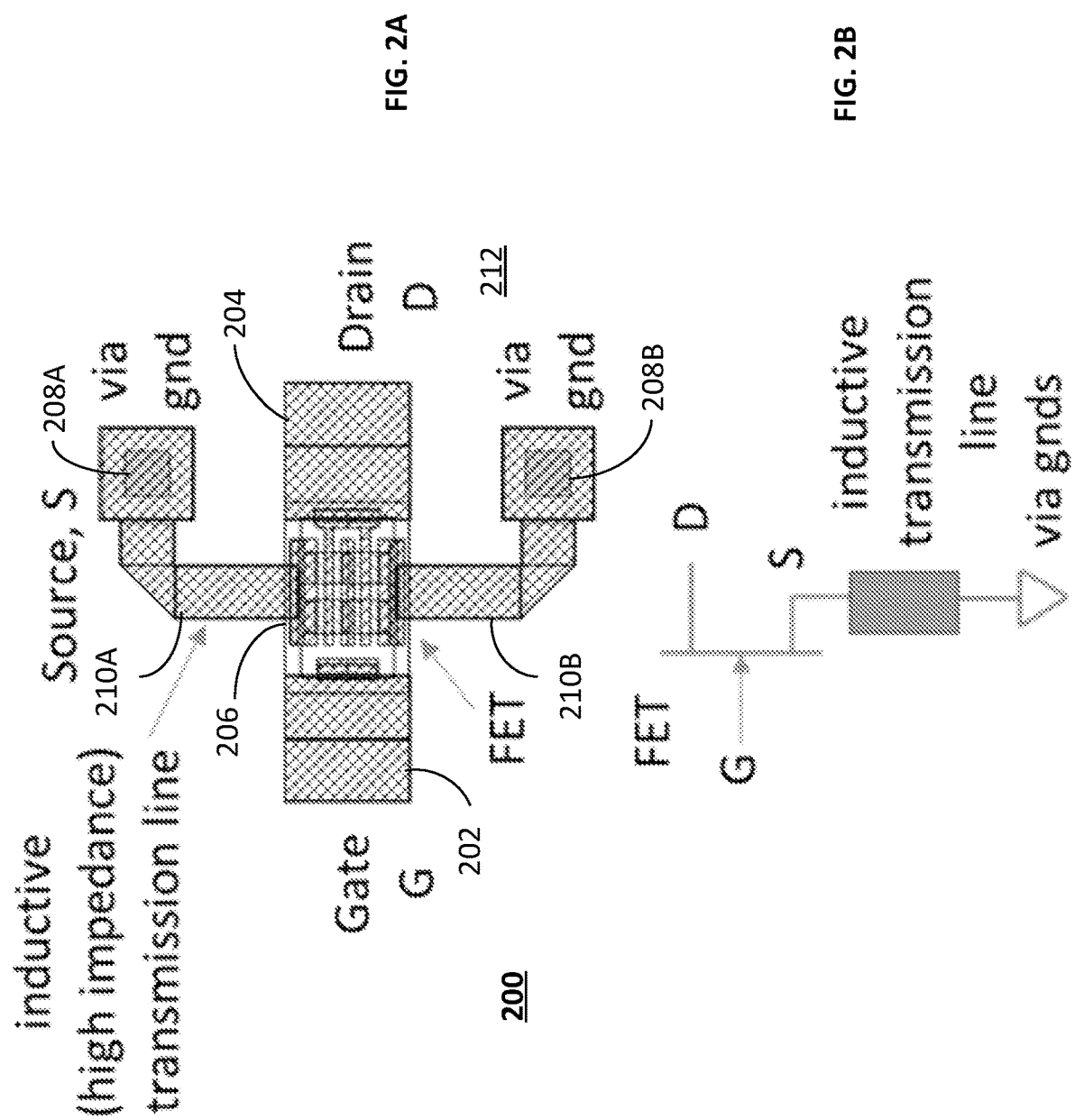

HIGH EFFICIENCY WIDEBAND FEEDBACK AMPLIFIER

FIELD OF THE INVENTION

The present invention relates to solid-state amplifiers, and more specifically, to solid-state wideband power amplifiers.

BACKGROUND OF THE INVENTION

In microwave transmitters, solid-state power amplifiers have been increasingly replacing vacuum tube amplifiers for power amplification. In monolithic microwave integrated circuits (MMICs), distributed amplifiers have been the primary circuit topology applied to wideband power amplifiers, such as multi-octave and decade bandwidth amplifiers. Conventional distributed amplifiers may offer relatively flat or near-constant gain versus frequency, and relatively acceptable voltage standing wave ratios (VSWRs), for example, VSWRs of less than 2:1. Achieving a low VSWR, that is, a VSWR of as close to 1:1 as possible, is referred to as impedance matching. For example, a perfect impedance match is achieved at the load if a load impedance of 50 ohms is matched with a transmission line of 50-ohm characteristic impedance. Likewise, a perfect impedance match is achieved at the source if a source impedance of 50 ohms is matched with a transmission line with a characteristic impedance of 50 ohms. In conventional MMICs, distributed amplifiers typically do not operate efficiently as power amplifiers because the various field-effect transistors (FETs) that form the artificial transmission gate and drain lines may not be optimally loaded for output power or efficiency simultaneously at any frequency over a wide bandwidth while still maintaining a good impedance match.

In an attempt to overcome the disadvantages of distributed amplifiers in conventional MMICs, shunt or parallel negative feedback has been applied to field-effect transistors (FETs) to create more efficient wideband power amplifiers. With increasing demands for wider bandwidths in microwave transmitters, however, conventional shunt or parallel negative feedbacks typically exhibit limitations in wideband power amplifiers. As the bandwidth increases from two octaves (4:1 bandwidth—for instance, 4 to 16 GHz) to three octaves (8:1 bandwidth—for instance, 2 to 16 GHz) or even higher, for example, to one decade (10:1 bandwidth—for instance, 2 to 20 GHz), the amount of negative feedback that needs to be applied at lower frequencies to maintain a flat amplifier response, that is, a near-constant gain over a wide frequency band, reduces overall output power and efficiency of the amplifier, as well as linearity performance of the amplifier over some portions of the frequency band.

A typical FET is a three-terminal semiconductor device with gate, drain, and source ports. Applying a voltage to the gate, with respect to the source, controls the amount of current that flows from FET drain to source. The ratio of change in drain-source current to change in gate-source voltage is referred to as FET transconductance. A typical common-source FET microwave power amplifier ties the source port to radio-frequency (RF) and direct-current (DC) ground. RF input power is applied to the FET gate, and RF output power is transferred from the FET drain port (drain to source ground) to the load, which may be an antenna, or another circuit element. In conventional power amplifier circuits, the grounding of the FET source port of the amplifier is typically achieved with the lowest impedance circuit possible, to minimize the risk of out-of-band amplifier stability, and to achieve high efficiency over a narrow bandwidth. This configuration, however, often results in poor wideband output match of the amplifier to the load impedance, for example, a load impedance of 50 ohms.

These and other drawbacks may be present in conventional FET power amplifiers.

SUMMARY

Accordingly, at least one aspect of an embodiment of the present disclosure is to address one or more of the drawbacks set forth above. According to one embodiment of the disclosure, a device comprises: a transistor comprising: a source, a drain and a gate; and an inductive element coupled between the source and a radio frequency (RF) ground to provide series feedback to the transistor.

According to another embodiment, a multistage wideband amplifier circuit comprises: a first-stage amplifier, comprising: a first transistor comprising a first source, a first drain and a first gate; and a first inductive element coupled between the first source and a radio frequency (RF) ground to provide first series feedback to the first transistor; and a final-stage amplifier, comprising: a second transistor comprising a second source, a second drain and a second gate; and a second inductive element coupled between the second source and the radio frequency (RF) ground to provide second series feedback to the second transistor.

According to yet another embodiment, a multistage wideband amplifier circuit comprises: a first amplifier, comprising: a first transistor comprising a first source, a first drain and a first gate; and a first inductive element coupled between the first source and a radio frequency (RF) ground to provide first series feedback to the first transistor; a second amplifier, comprising: a second transistor comprising a second source, a second drain and a second gate; and a second inductive element coupled between the second source and the radio frequency (RF) ground to provide second series feedback to the second transistor; and a third amplifier, comprising: a third transistor comprising a third source, a third drain and a third gate; and a third inductive element coupled between the third source and the radio frequency (RF) ground to provide third series feedback to the third transistor. A multistage amplifier may include additional FET stages each making use of a series or source feedback.

These and other disclosures and advantages will become apparent from the following detailed description, taken in conjunction with the accompanying drawings, illustrating by way of example the principles of the various exemplary embodiments.

BRIEF DESCRIPTION OF THE DRAWINGS

In order to facilitate a fuller understanding of the disclosures, reference is now made to the appended drawings. These drawings should not be construed as limiting the present invention, but are intended to be exemplary only.

FIG. 2A is a plan view of a FET with an inductive element in accordance with an embodiment of the disclosure.

FIG. 2B is a circuit diagram representing the FET with an inductive element in accordance with an embodiment of the disclosure.

DETAILED DESCRIPTION OF EXEMPLARY EMBODIMENTS

According to an embodiment of the disclosure, a series or source feedback is provided to a transistor amplifier, such as a FET amplifier, to achieve improved amplifier output power, improved efficiency, better impedance match, and lower input and output VSWR. In an embodiment, the series or source feedback is provided by an inductive element coupled between the source and radio frequency (RF) ground to provide a series or source feedback to the transistor amplifier. In an embodiment, the transistor amplifier is a wideband microwave or millimeter wave power amplifier. In an embodiment, the inductive element comprises a first transmission line having an impedance characteristic over an operative bandwidth of the transistor amplifier, the impedance characteristic including an inductive reactance that increases with increasing frequency.

Figure 1A:
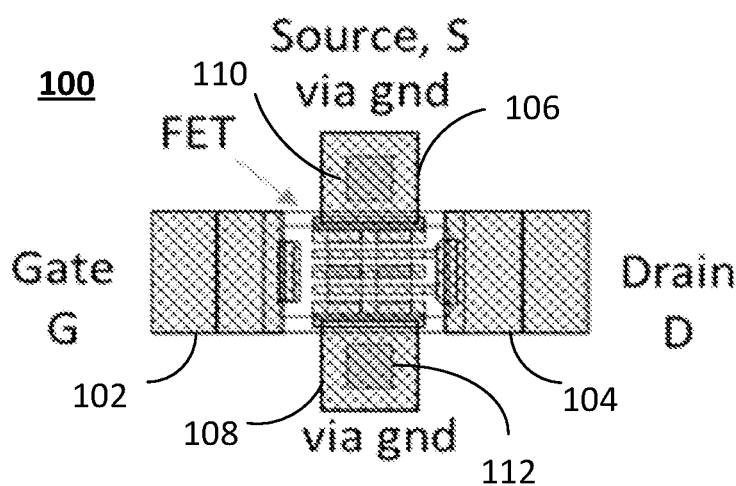
FIG. 1A is a plan view of a configuration of a typical FET.
Figure 1B:
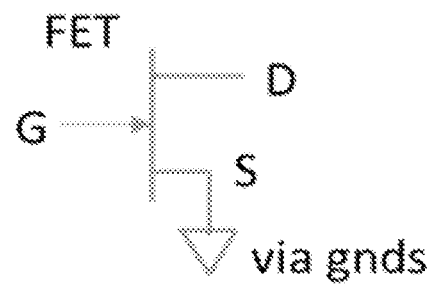
FIG. 1B is a circuit diagram representing the typical FET of FIG. 1A.

FIG. 1A is a plan view of a configuration of a typical FET 100 having a gate 102, a drain 104 and a source which has two terminals 106 and 108, which are directly connected to via ground 110 and 112, respectively. FIG. 1B is a circuit diagram representing the typical FET of FIG. 1A.

FIG. 2A is a plan view of a FET with an inductive element which provides a series or source feedback to the FET for improved amplifier output power, higher efficiency, good impedance match, and low input and output VSWR in accordance with an embodiment of the disclosure. In the embodiment shown in FIG. 2A, FET 200 has a gate 202, a drain 204, and a source 206, which is connected to two via grounds 208A and 208B through two inductive elements 210A and 210B, respectively. FIG. 2B is a circuit diagram representing the FET circuit of FIG. 2A, with a transmission line serving as an inductive element connected between the source and the via ground(s). In an embodiment, inductive elements 210A and 210B may each comprise a transmission line. In an embodiment, the transmission line may be a high-impedance transmission line in the form of a microstrip disposed on a substrate 212. Alternatively, inductive elements 210A and 210B may be realized as other types of high-impedance transmission lines, such as striplines or coplanar waveguides, for example.

For microwave and millimeter-wave FET power amplifiers, series or source feedback may be implemented by placing physical transmission lines, such as microstrips, coplanar waveguides, striplines, or other types of transmission lines, between the source of the FET and RF ground. These transmission lines are able to provide an inductive impedance characteristic over an operating bandwidth of the amplifier, thus increasing the inductive reactance with increasing frequency. An embodiment in which inductive elements that provide a series or source feedback comprise coplanar waveguides will be described in further detail below with reference to FIG. 10.

In the embodiment shown in FIG. 2A, inductive elements 210A and 210B are positioned opposite each other and symmetric about source 206. Although FIG. 2A shows an embodiment which employs two inductive elements 208A and 208B, where inductive element 208A is connected between source 206 and via ground 210A and inductive element 208B is connected between source 206 and via ground 210B, various other circuit layouts which employ at least one inductive element between the source and the ground can also be implemented within the scope of the disclosure. For example, inductive elements 210A and 210B need not be positioned opposite each other and symmetric about source 206 of FET 200 in an alternate embodiment. Moreover, it is not necessary that two inductive elements be connected to the source of each FET in a microwave or millimeter wave power amplifier circuit. For example, a single inductive element may be connected between the source of a FET and ground instead of two inductive elements. In other embodiments, more than two inductive elements may be connected between the source of a FET and ground.

The power amplifier circuit which includes a series or source feedback provided by an inductive element between the source of a FET and ground may be implemented in various types of MMICs. For example, in a MMIC power amplifier, the FET may be a gallium arsenide (GaAs) or gallium nitride (GaN) device, and the substrate may be a silicon carbide (SiC) substrate, a silicon (Si) substrate, or a substrate of another material, such as gallium arsenide (GaAs) or diamond. The power amplifier circuit in accordance with embodiments of the disclosure may also be implemented in other types of semiconductor devices, for example, other III-V or II-VI compound semiconductor devices, for radio-frequency (RF), microwave and millimeter wave applications. A FET with series or source feedback in the form of an inductive element may also be applied in a hybrid amplifier, in which the FET and matching networks need not be fabricated on the same substrate, in order to increase amplifier power efficiency while maintaining a low VSWR over a wide bandwidth.

Figure 3A:
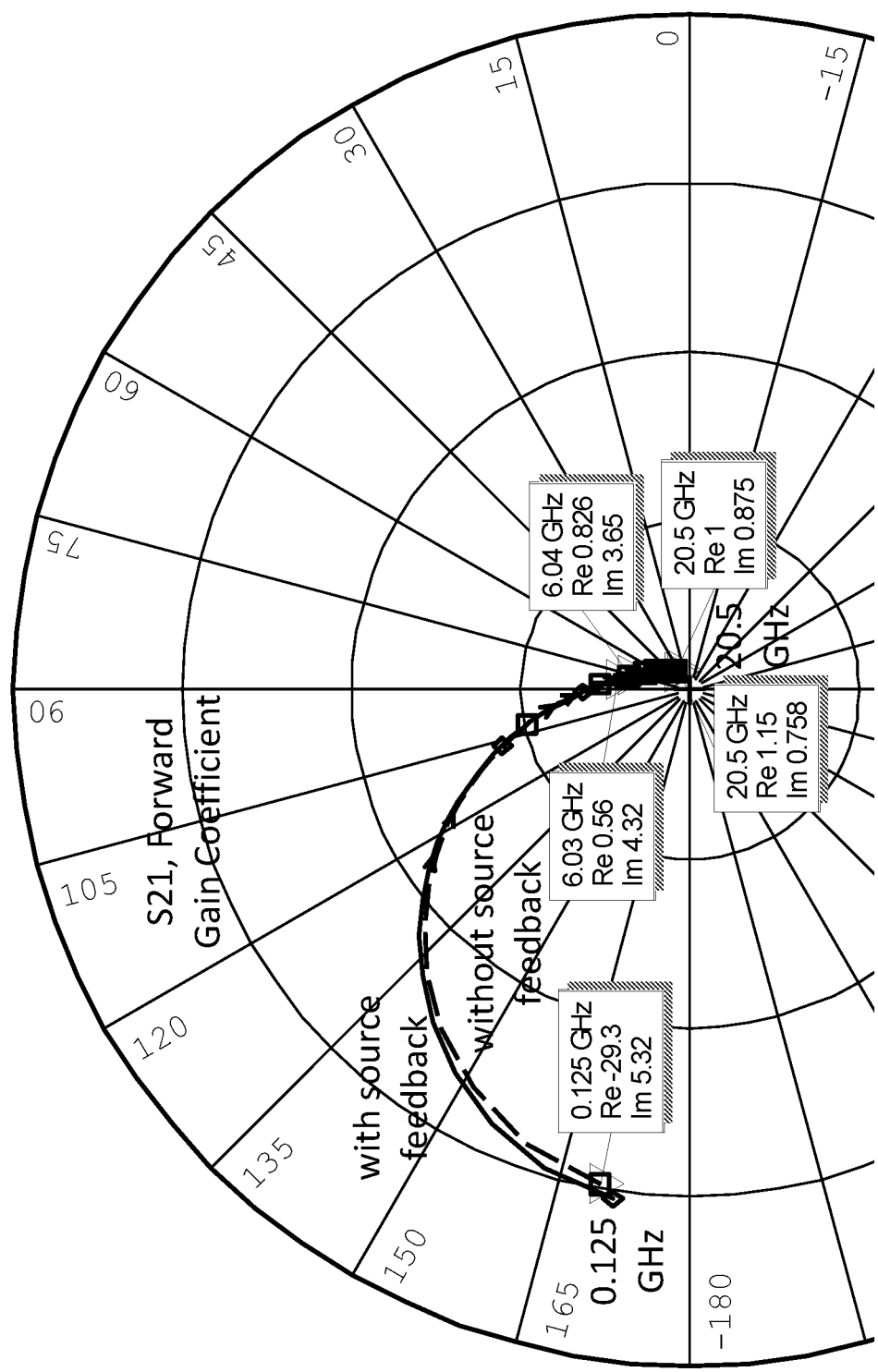
FIG. 3A is an example of a plot of complex forward gain coefficients S21 of a FET on a complex plane, with and without series or source feedback.

With an embodiment of the present invention, the impact of series or source feedback on the RF characteristics of a wideband power amplifier FET can be modeled accurately. FIG. 3A illustrates an example of the complex forward gain coefficient, S21, of the FET with series or source feedback provided by the inductive elements of FIGS. 2A and 2B, plotted as a solid curve from 0.125 GHz to 20.5 GHz, on a complex plane. In contrast, the complex forward gain coefficient S21 of a FET without series or source feedback is plotted as a dashed curve from 0.125 GHz to 20.5 GHz in FIG. 3A.

Figure 3B:
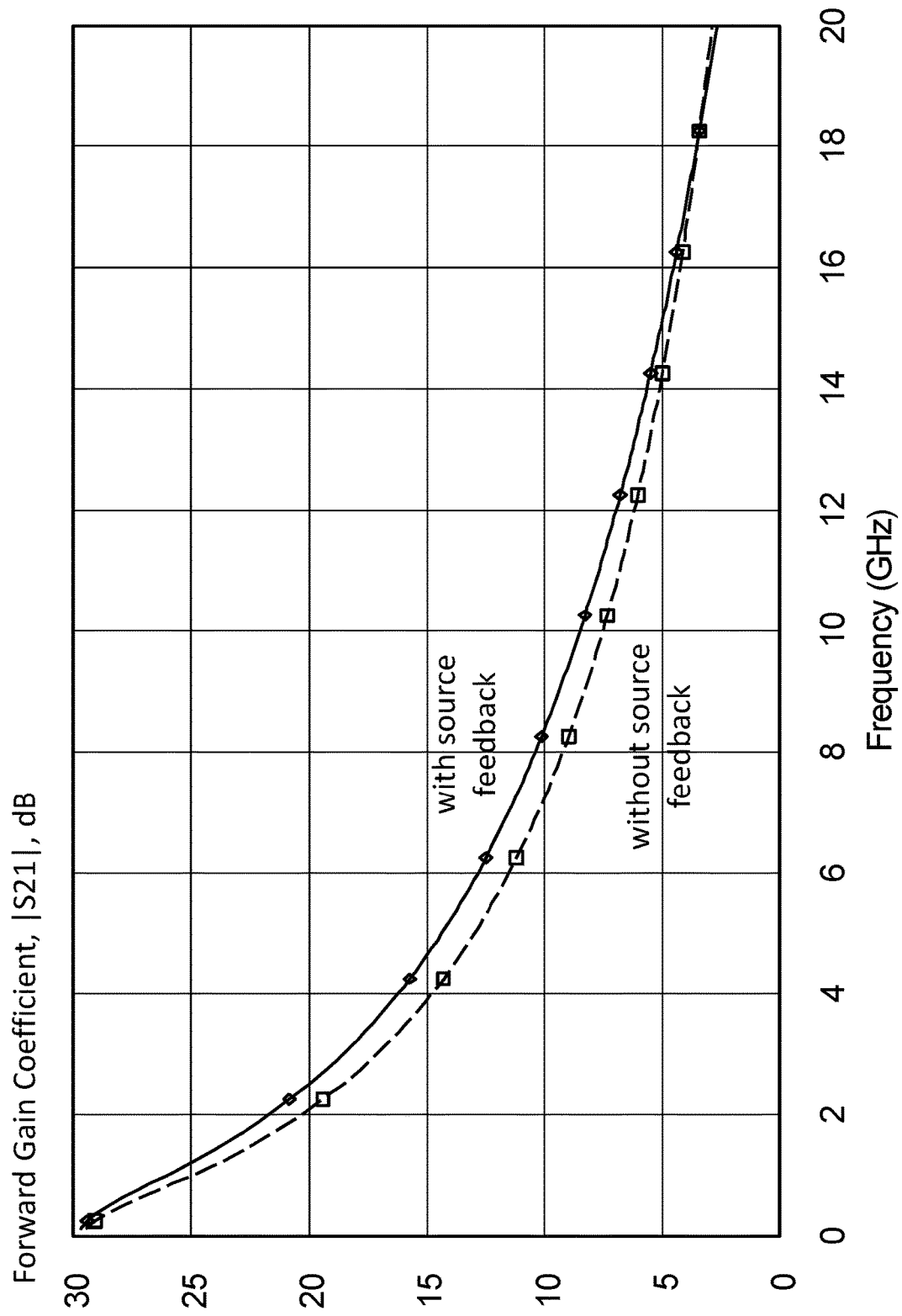
FIG. 3B is an example of a plot of the magnitudes of forward gain coefficients |S21| of a FET over a frequency range, with and without series or source feedback.

FIG. 3B illustrates an example of the magnitude (in dB) of the forward gain coefficient, |S21|, of the FET with series or source feedback provided by the inductive elements of FIGS. 2A and 2B, plotted as a solid curve over a given frequency range. In contrast, the magnitude (in dB) of the forward gain coefficient |S21| of a FET without series or source feedback is plotted as a dashed curve over the same frequency range in FIG. 3B. As shown in FIGS. 3A and 3B, the forward gain coefficient of a given FET does not change significantly with or without series or source feedback.

Figure 4A:
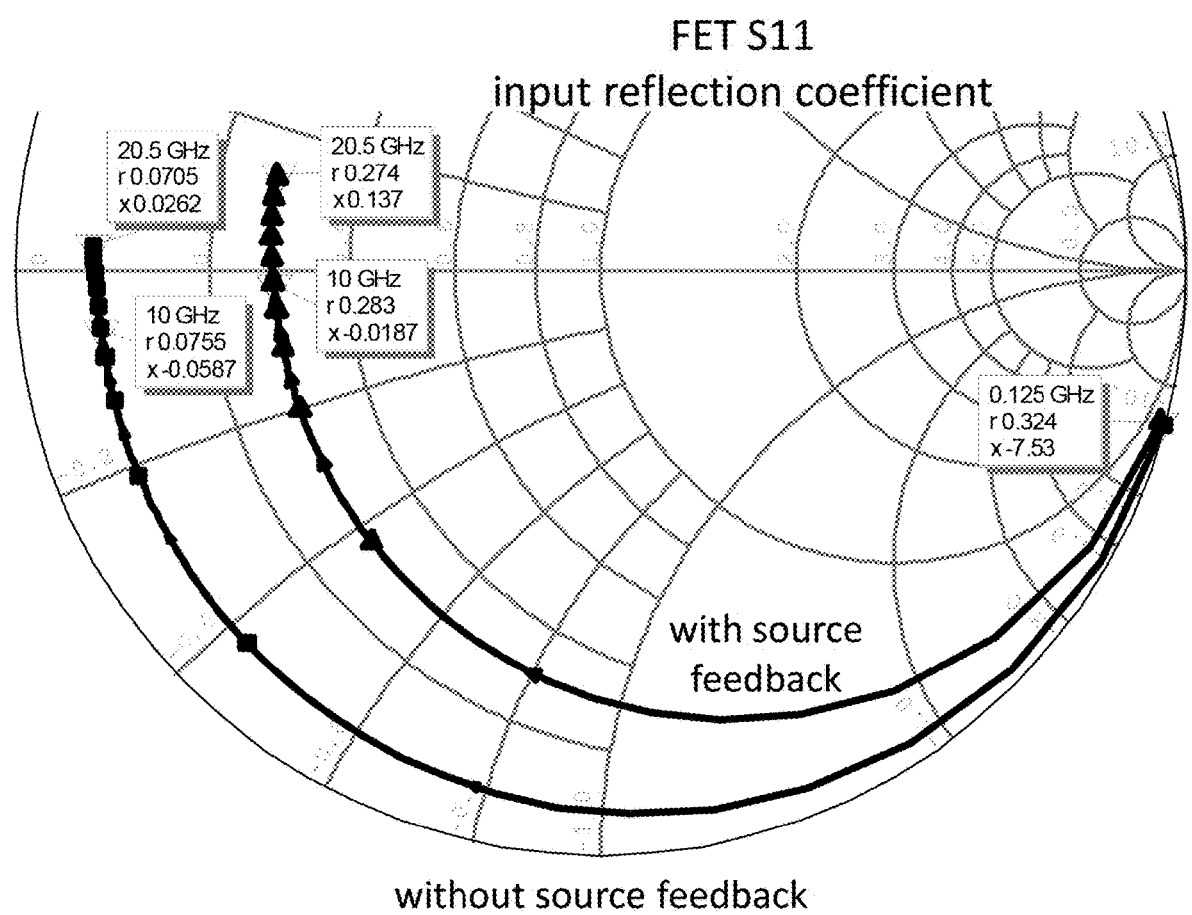
FIG. 4A is a Smith chart with an example of a plot of input reflection coefficients, S11, with and without series or source feedback.
Figure 4B:
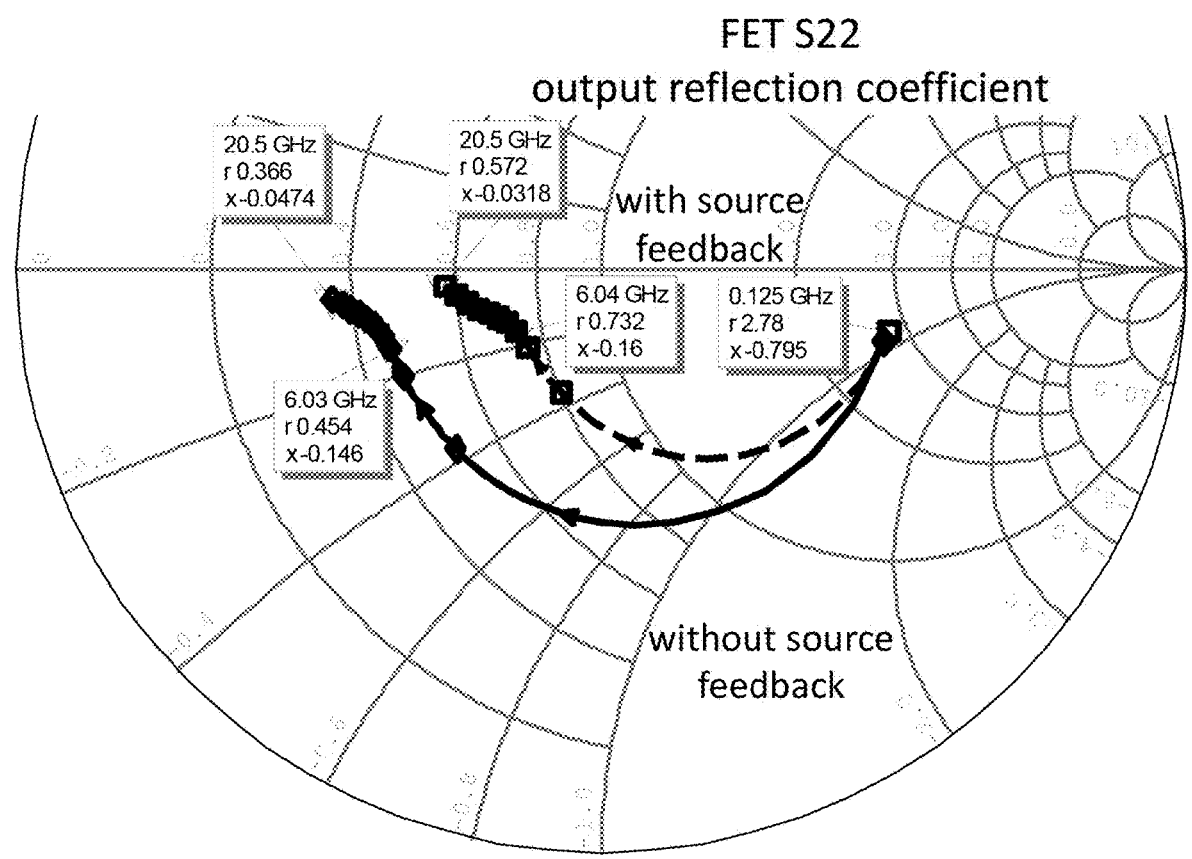
FIG. 4B is a Smith chart with an example of a plot of output reflection coefficients, S22, with and without series or source feedback.

FIG. 4A is a Smith chart illustrating an example of a plot of input reflection coefficients, S11, with and without series or source feedback, while FIG. 4B is a Smith chart illustrating an example of a plot of output reflection coefficients, S22, with and without series or source feedback. As shown in FIGS. 4A and 4B, applying a series or source feedback to a FET transforms both input and output reflection coefficients, S11 and S22, closer to the centers of respective Smith charts, that is, closer to a perfect impedance match (in this example, 50 ohms) at both the input and the output of the amplifier. By moving the S11 and S22 curves closer to the centers of respective Smith charts over a wide frequency range, more efficient wideband power amplification with better impedance matching may be achieved with the addition of a series or source feedback to the FET.

As shown in FIGS. 4A and 4B, applying a series or source feedback to a FET helps transform both FET input and output impedances closer to source and load impedances, respectively, for example, to an impedance of 50 ohms. A circuit designer may take advantage of this in many ways, including, for example, by (1) increasing the operative bandwidth of an amplifier, compared to that of an amplifier which does not use a series or source feedback, and/or (2) optimizing performance parameters of an amplifier over a fixed bandwidth, for example, increased power-added efficiency and improved output return loss, compared to those of an amplifier which does not use a series or source feedback.

Figure 5:
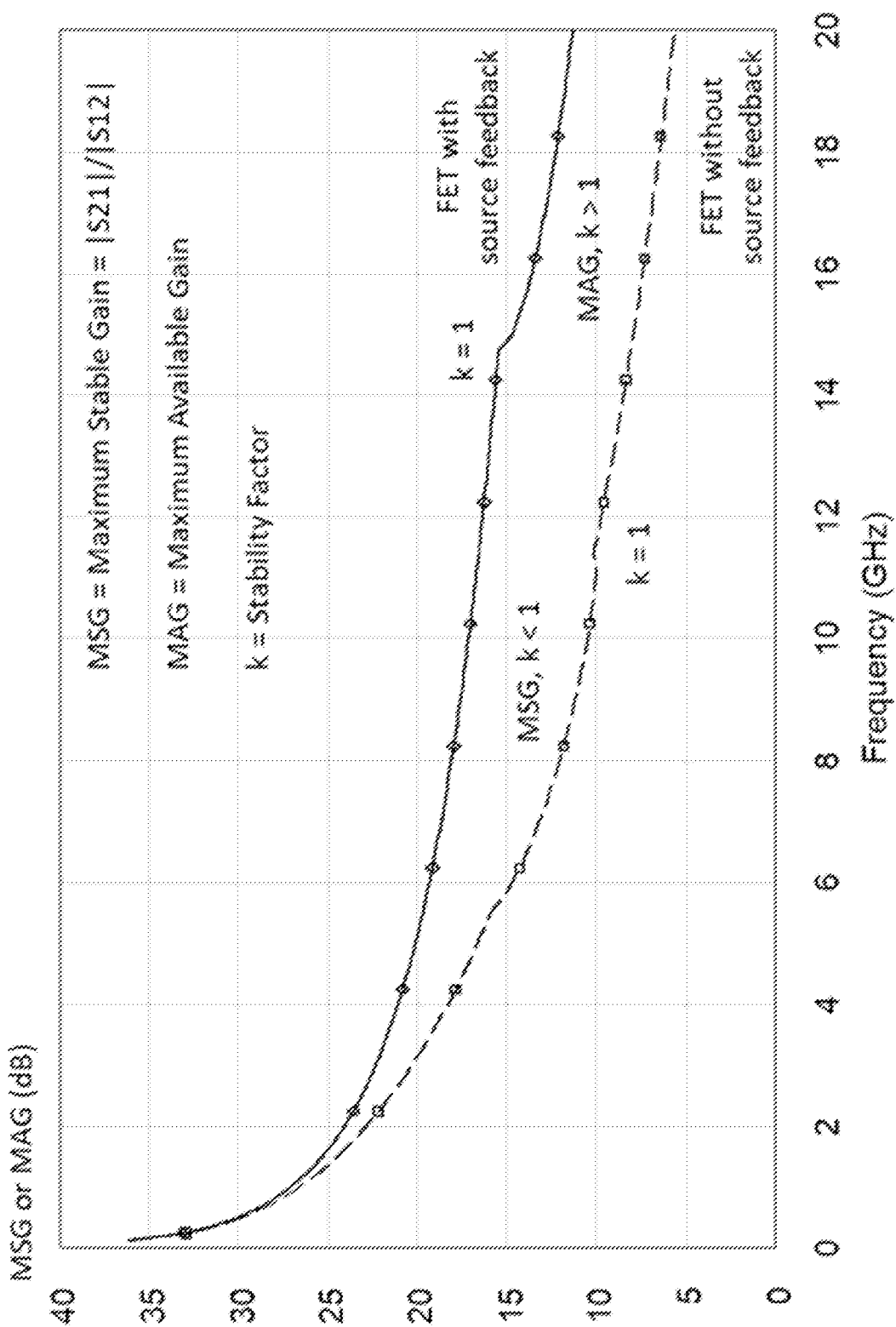
FIG. 5 is an example of a plot of the maximum stable gain (MSG) or maximum available gain (MAG) over a frequency range for a FET with and without series or source feedback.

FIG. 5 is an example of a plot of maximum stable gain (MSG) or maximum available gain (MAG) over a wide frequency range for a FET with and without series or source feedback. MSG is defined as the ratio of the magnitude of the forward gain coefficient to the magnitude of the reverse isolation coefficient (|S21|/|S12|), while MAG is the maximum gain that takes into account the effect of FET input and output impedances and can be calculated when the stability factor, k, is greater than 1.

In the example shown in FIG. 5, the FET with series or source feedback has a stability factor k of less than 1 at frequencies less than 14.6 GHz and greater than 1 at frequencies greater than 14.6 GHz, whereas the FET without series or source feedback has a stability factor k of less than 1 at frequencies less than 11.3 GHz and greater than 1 at frequencies greater than 11.3 GHz. As illustrated by the solid curve representing the MSG or MAG of a FET with series or source feedback and the dashed curve representing the MSG or MAG of a FET without series or source feedback in FIG. 5, the MSG or MAG of a FET with series or source feedback is greater than that of a FET without series or source feedback over a wide frequency range.

In the example shown in FIG. 5, the provision of a series or source feedback increases the frequency that must be reached for the FET to become unconditionally stable, that is when the stability factor k is greater than 1. In this example, the stability factor k of the FET with series or source feedback reaches 1 at 14.6 GHz in FIG. 5, compared to 11.3 GHz without the feedback applied. The FET with series or source feedback can be matched to a higher gain level, for example, to 12 dB at 18 GHz, compared to 6 dB at 18 GHz for a FET without series or source feedback. A circuit designer can take advantage of this higher gain-matching option when designing a wideband power amplifier to achieve increased power gain and power-added efficiency over a broad frequency range.

Figure 6:
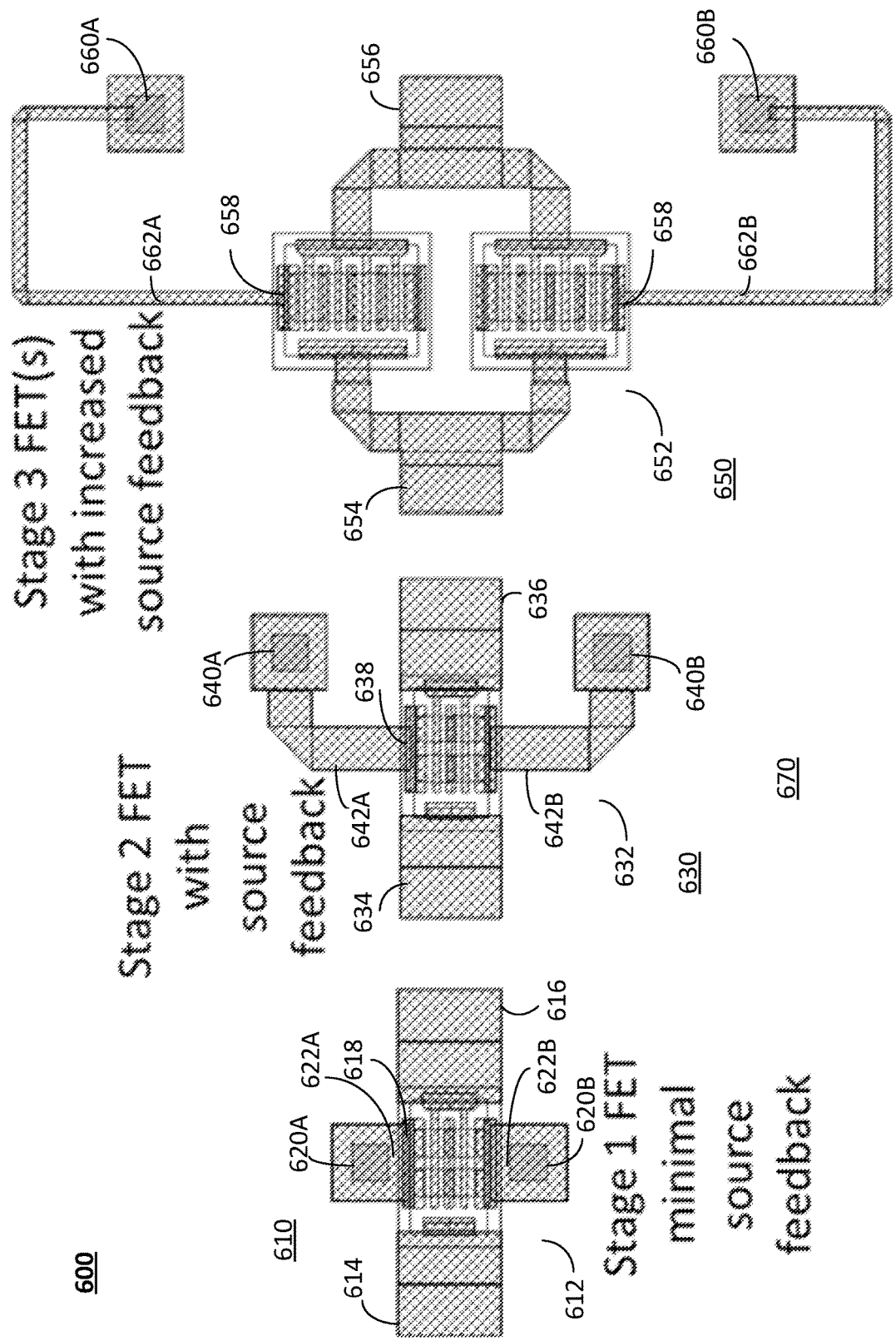
FIG. 6 is a plan view of a multistage wideband amplifier circuit with three stages of FET amplifiers each having a series or source feedback provided by at least one inductive element in accordance with an embodiment of the disclosure.

FIG. 6 is a plan view of a multistage wideband amplifier circuit with three stages of FET amplifiers each having a series or source feedback provided by an inductive element in accordance with an embodiment of the disclosure. In the example shown in FIG. 6, multistage wideband amplifier circuit 600 includes a first-stage FET amplifier 610, a second-stage FET amplifier 630, and a third-stage FET amplifier 650.

First-stage FET amplifier 610 includes a first FET 612 having a gate 614, a drain 616 and a source 618. Source 618 is connected to two via grounds 620A and 620B through two inductive elements 622A and 622B, respectively. In an embodiment, inductive elements 622A and 622B in first-stage FET amplifier 610 may have a relatively small inductance compared to the inductive elements of later-stage FET amplifiers, which will be described in further detail below. In an embodiment, inductive elements 622A and 622B with a relatively small inductance may be implemented as transmission lines with a relatively short length, as shown in FIG. 6. In an embodiment, inductive elements 622A and 622B may each comprise a transmission line. In an embodiment in which power amplifier circuit 600 is implemented on a MMIC, the transmission line may be a high-impedance transmission line in the form of a microstrip disposed on a substrate 670. Alternatively, inductive elements 622A and 622B may be implemented as other types of high-impedance transmission lines, such as striplines or coplanar waveguides, for example.

In the embodiment shown in FIG. 6, second-stage FET amplifier 630 includes a second FET 632 having a gate 634, a drain 636 and a source 638. Source 638 is connected to two via grounds 640A and 640B through two inductive elements 642A and 642B, respectively. In an embodiment, inductive elements 642A and 642B in second-stage FET amplifier 630 may have an inductance greater than inductive elements 622A and 622B in first-stage amplifier 610. In an embodiment, inductive elements 642A and 642B in second-stage FET amplifier 630 may be implemented as transmission lines longer than inductive elements 622A and 622B in first-stage FET amplifier 610, as shown in FIG. 6. In an embodiment, inductive elements 642A and 642B may each comprise a transmission line, such as a microstrip disposed on substrate 670. Alternatively, inductive elements 642A and 642B may be implemented as other types of high-impedance transmission lines, such as striplines or coplanar waveguides, for example.

In the embodiment shown in FIG. 6, third-stage FET amplifier 650 includes a third FET 652 having a gate 654, a drain 656 and a source 658. Source 658 is connected to two via grounds 660A and 660B through two inductive elements 662A and 662B, respectively. In an embodiment, inductive elements 662A and 662B in third-stage FET amplifier 650 may have an inductance greater than inductive elements 642A and 642B in second-stage amplifier 630, which may in turn have an inductance greater than inductive elements 622A and 622B in first-stage amplifier 610. In an embodiment, inductive elements 662A and 662B in third-stage FET amplifier 650 may be implemented as transmission lines longer than inductive elements 642A and 642B in second-stage FET amplifier 630, which may in turn be longer than inductive elements 622A and 622B in first-stage FET amplifier 610, as shown in FIG. 6. Inductive elements in later-stage amplifiers need not be longer than inductive elements in earlier-stage amplifiers in all cases, however. There may be cases in which an earlier-stage amplifier may require more series or source feedback than a later-stage amplifier, depending on the differences in transistor sizes or gate widths in different stages of amplifiers. In such cases, an inductive element in a later-stage amplifier may have a length shorter than an inductive element in an earlier-stage amplifier. In an embodiment, inductive elements 662A and 662B may each comprise a transmission line, such as a microstrip disposed on substrate 670. Alternatively, inductive elements 662A and 662B may be implemented as other types of high-impedance transmission lines, such as striplines or coplanar waveguides, for example.

Although the multistage amplifier example illustrated in FIG. 6 and described above comprises three stages of FET amplifiers, a multistage amplifier may comprise two stages of FET amplifiers in another embodiment. Alternatively, a multistage amplifier may comprise more than three stages of FET amplifiers. In an embodiment, the inductive elements in the initial-stage amplifier may have the lowest inductance and thus the shortest length, while the inductive elements in later-stage amplifiers may have progressively greater inductances and thus progressively greater lengths, and the final-stage amplifier may have the greatest inductance and thus the greatest length compared to other stages of the amplifier.

Figure 7:
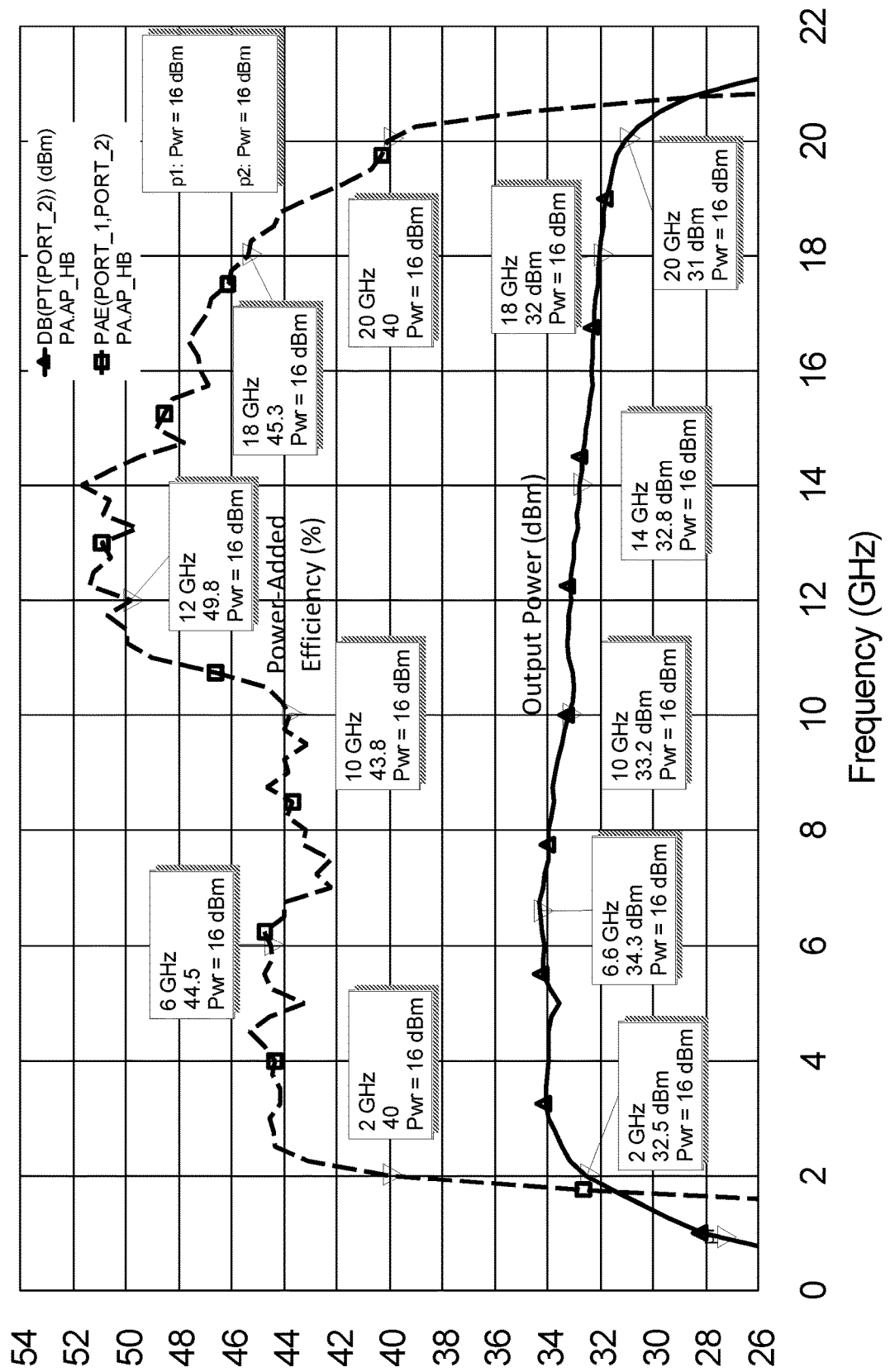
FIG. 7 is an example of a plot of power-added efficiency and output power over a frequency range when series or source feedback provided by inductive elements is applied to a FET power amplifier circuit.
Figure 8:
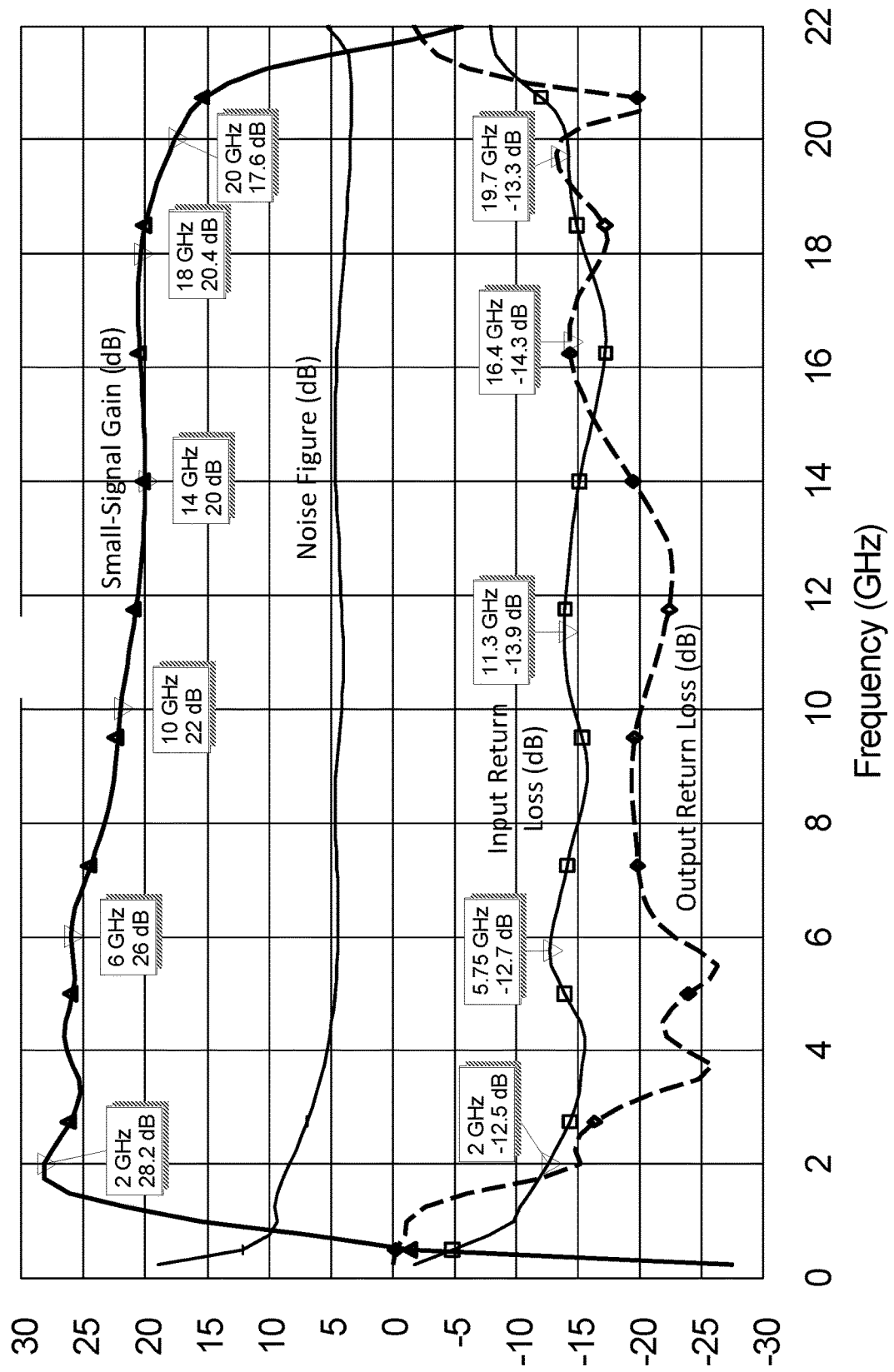
FIG. 8 is an example of a plot of small-signal gain, noise figure, input return loss and output return loss when series or source feedback provided by inductive elements is applied to a FET power amplifier circuit.

FIG. 7 is an example of a plot of power-added efficiency and output power when series or source feedback provided by inductive elements is applied to a FET power amplifier circuit with two stages of GaN FETs, over a decade (10:1) bandwidth, from 2 GHz to 20 GHz. FIG. 8 is an example of a plot of small-signal gain, noise figure, input return loss and output return loss when series or source feedback provided by inductive elements is applied to a FET power amplifier circuit with two stages of GaN FETs, over a decade (10:1) bandwidth, from 2 GHz to 20 GHz. As illustrated by FIGS. 7 and 8, wideband FET power amplifiers employing series or source feedback offer higher gain per FET stage than conventional distributed amplifiers of similar physical dimensions offering similar output power and bandwidth. Series or source feedback according to embodiments of the disclosure may provide increased amplifier efficiency because a high-gain FET output stage requires less RF input power from earlier FET stages, thus reducing DC power required by those earlier FET stages. In addition, a lower insertion loss output matching network may be applied to the FET output stage since the impedance match from FET (for example, to 50 ohms) is simplified by using a series or source feedback. Such an impedance match may also help increase amplifier efficiency.

Figure 9:
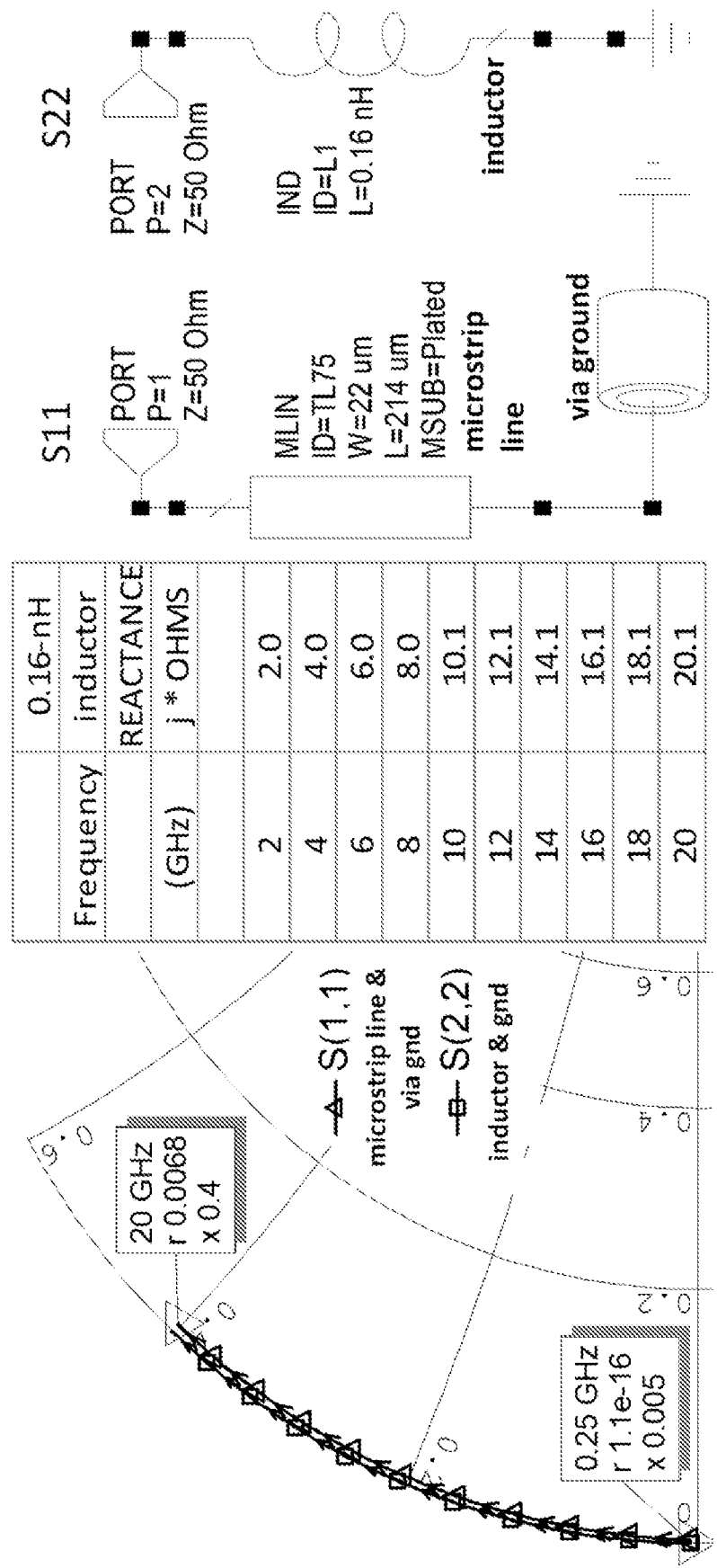
FIG. 9 is an example of a plot on a portion of a Smith chart illustrating the input impedances of an "ideal" inductor with ground, and those of a microstrip and via ground on a silicon carbide substrate over a frequency range.

FIG. 9 is an example of a plot on a portion of a Smith chart illustrating the input impedances of an "ideal" 0.16 nH inductor with ground, and those of a microstrip and via ground on a silicon carbide substrate. In this example, the microstrip line width is 22 µm, the microstrip line length is 214 µm, and the via ground is a plated gold "cylinder" that runs from top to bottom (RF ground) of a 75-µm thick silicon carbide substrate. The input impedances for both structures are plotted on the Smith chart over a frequency range from 0.25 GHz to 20 GHz. As illustrated in FIG. 9, for practical purposes, the "ideal" 0.16 nH inductor and the microstrip with a length of 214 µm and a width of 22 µm connected to via ground are equivalent to each other over the frequency range of 0.25 GHz to 20 GHz, as plotted on the Smith chart.

Figure 10:
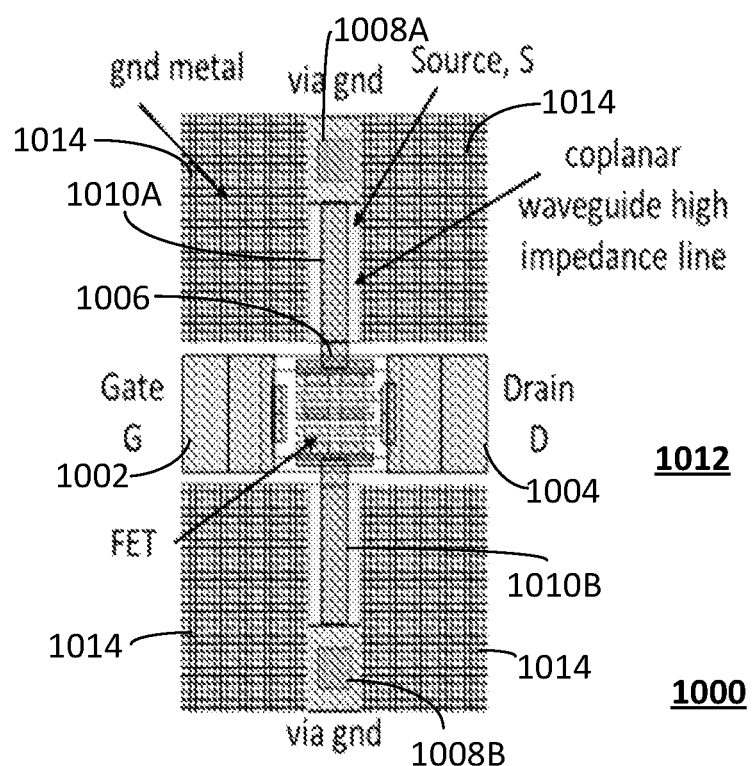
FIG. 10 is a plan view of a FET amplifier in which inductive elements are implemented as coplanar waveguides to provide a series or source feedback to the FET in accordance with an embodiment of the disclosure.

FIG. 10 is a plan view of a FET amplifier in which the inductive elements are implemented as coplanar waveguides to provide a series or source feedback to the FET for improved amplifier output power, higher efficiency, good impedance match, and low output VSWR in accordance with an embodiment of the disclosure. In the embodiment shown in FIG. 10, FET 1000 has a gate 1002, a drain 1004, and a source 1006, which is connected to two via grounds 1008A and 1008B through two coplanar waveguide lines 1010A and 1010B, respectively, on a substrate 1012. In the example of coplanar waveguide configuration shown in FIG. 10, in addition to coplanar waveguides 1010A and 1010B, which are signal-carrying transmission lines, a ground plane 1014 is also provided on substrate 1012, on the same surface on which coplanar waveguides 1010A and 1010B are positioned.

Other embodiments, uses and advantages will be apparent to those skilled in the art from consideration of the specification and practice of the subject matter disclosed herein. The specification and examples should be considered exemplary only. The intended scope of the invention is only limited by the claims appended hereto.

The invention claimed is:

1. A device, comprising:
a transistor comprising a source, a drain and a gate; and
an inductive element coupled between the source and a radio frequency (RF) ground to provide series feedback to the transistor, wherein the inductive element comprises a first transmission line having an impedance characteristic over an operative bandwidth of the transistor, the impedance characteristic including an inductive reactance that increases with increasing frequency.

2. The device of claim 1, wherein the transistor comprises a wideband microwave field effect transistor (FET).

3. The device of claim 1, wherein the transistor comprises a wideband millimeter wave field effect transistor (FET).

4. The device of claim 1, wherein the first transmission line comprises a coplanar waveguide transmission line.

5. The device of claim 1, wherein the first transmission line comprises a microstrip transmission line.

6. The device of claim 5, further comprising a substrate, wherein the microstrip transmission line is positioned on the substrate, and wherein the RF ground comprises a via ground in the substrate.

7. The device of claim 6, further comprising:
an additional via ground in the substrate; and
an additional inductive element coupled between the source and the additional via ground.

8. The device of claim 7, wherein the additional inductive element comprises a second transmission line.

9. The device of claim 8, wherein the first and second transmission lines are positioned opposite each other.

10. A multistage wideband amplifier circuit, comprising:
a first-stage amplifier, comprising:
a first transistor comprising a first source, a first drain and a first gate; and
a first inductive element coupled between the first source and a radio frequency (RF) ground to provide a first series feedback to the first transistor; and
a final-stage amplifier, comprising:
a second transistor comprising a second source, a second drain and a second gate; and a second inductive element coupled between the second source and the radio frequency (RF) ground to provide a second series feedback to the second transistor, wherein each of the inductive elements comprises a transmission line having an impedance characteristic over an operative bandwidth of each of the amplifiers, the impedance characteristic of each of the inductive elements including an inductive reactance that increases with increasing frequency.

11. The circuit of claim 10, further comprising at least one intermediate-stage amplifier coupled between the first-stage amplifier and the final-stage amplifier, wherein said at least one intermediate-stage amplifier comprises a third transistor comprising a third source, a third drain and a third gate.

12. The circuit of claim 11, further comprising a third inductive element coupled between the third source and radio frequency (RF) ground to provide a third series feedback to the third transistor.

13. The circuit of claim 10, wherein each of the inductive elements comprises a microstrip transmission line or a coplanar waveguide transmission line.

14. The circuit of claim 10, further comprising a substrate, wherein the RF ground comprises a plurality of via grounds in the substrate, and wherein the inductive element in each of the amplifiers comprises a transmission line coupled between the source of each of the transistors and each of the plurality of via grounds.

15. A multistage wideband amplifier circuit, comprising:
a first amplifier, comprising:
a first transistor comprising a first source, a first drain and a first gate; and
a first inductive element coupled between the first source and a radio frequency (RF) ground to provide a first series feedback to the first transistor;
a second amplifier, comprising:
a second transistor comprising a second source, a second drain and a second gate; and
a second inductive element coupled between the second source and the radio frequency (RF) ground to provide a second series feedback to the second transistor; and
a third amplifier, comprising:
a third transistor comprising a third source, a third drain and a third gate; and
a third inductive element coupled between the third source and the radio frequency (RF) ground to provide a third series feedback to the third transistor, wherein each of the inductive elements comprises a transmission line having an impedance characteristic over an operative bandwidth of each of the amplifiers, the impedance characteristic of each of the inductive elements including an inductive reactance that increases with increasing frequency.

16. The circuit of claim 15, wherein each of the inductive elements comprises a microstrip transmission line or a coplanar waveguide transmission line.

17. The circuit of claim 15, further comprising a substrate, wherein the RF ground comprises a plurality of via grounds in the substrate, and wherein the inductive element in each of the amplifiers comprises a transmission line coupled between the source of each of the transistors and each of the plurality of via grounds.

* * * * *